United States Patent
Kamigaichi (10) Patent No.: US 8,300,475 B2
(45) Date of Patent: Oct. 30, 2012

(54) NONVOLATILE SEMICONDUCTOR MEMORY DEVICE

(75) Inventor: Takeshi Kamigaichi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 299 days.

(21) Appl. No.: 12/824,606

(22) Filed: Jun. 28, 2010

(65) Prior Publication Data
US 2010/0329033 A1    Dec. 30, 2010

(30) Foreign Application Priority Data
Jun. 30, 2009    (JP) ................. 2009-154856

(51) Int. Cl.
*G11C 11/34* (2006.01)
*G11C 16/04* (2006.01)
(52) U.S. Cl. .................. 365/185.24; 365/185.03
(58) Field of Classification Search ............. 365/185.03, 365/185.24
See application file for complete search history.

(56) References Cited

U.S. PATENT DOCUMENTS

| | | | |
|---|---|---|---|
| 6,556,474 B1 | 4/2003 | Kobayashi et al. | |
| 6,888,758 B1 | 5/2005 | Hemink et al. | |
| 7,616,491 B2 | 11/2009 | Kamigaichi et al. | |
| 2007/0121378 A1* | 5/2007 | Shibata et al. | 365/185.03 |
| 2009/0290414 A1* | 11/2009 | Hosono | 365/185.03 |

FOREIGN PATENT DOCUMENTS

| | | |
|---|---|---|
| JP | 2001-126490 | 5/2001 |
| JP | 2007-305204 | 11/2007 |

OTHER PUBLICATIONS

U.S. Appl. No. 13/237,291, filed Sep. 20, 2011, Kamigaichi, et al.

* cited by examiner

*Primary Examiner* — Ly D Pham
(74) *Attorney, Agent, or Firm* — Oblon, Spivak, McClelland, Maier & Neustadt, L.L.P.

(57) ABSTRACT

In general, according to one embodiment, a nonvolatile semiconductor memory device includes: a memory cell array including memory cells; and a control unit to control a signal applied to the memory cells. Each of the memory cells are settable to: first, second and third states having first, second and third threshold voltage distributions (VD1, VD2 and VD3, VD1<VD3<VD2), respectively. In an operation of setting a second memory cell to the second state and setting a third memory cell to the third state, the control unit: sets the memory cells to the first state; sets the second memory cell to a state having a threshold voltage distribution between VD2 and VD3; performs a weak writing to increase a threshold voltage distribution of the memory cells; and sets the third memory cell to the third state.

19 Claims, 9 Drawing Sheets

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2009-154856, filed on Jun. 30, 2009; the entire contents of which are incorporated herein by reference.

FIELD

Embodiments described herein relate generally to a non-volatile semiconductor memory device.

BACKGROUND

Capacity increases are accelerating for nonvolatile semiconductor memory devices typified by NAND flash memory. When memory cells are shrunk to increase capacity, interlayer insulating films between the memory cells become thin and leak current increases. In the case of a planar memory cell, the coupling ratio decreases between the control gate and the floating gate. Therefore, programming data to the memory cell is insufficient; and shifting to high threshold values is particularly difficult. In particular, in the case of multi-bit memory cells, the maximum value of the threshold voltage cannot be kept within a constant level to improve the controllability; and the problems of insufficient shifting to the high threshold values recited above worsen.

Technology is discussed in JP-A 2001-126490 (Kokai) to increase speed and reliability by performing sequential programming from a state near an erase state after shifting to the threshold value furthest from the erase state in a multi-bit memory.

Further, technology is discussed in JP-A 2007-305204 (Kokai) to reduce capacitance coupling noise by performing a weak programming after the erasing operation and subsequently performing multi-level programming operations to raise the lower limit value of the threshold distribution of the erase state and amounts of threshold shifting is smaller in programming operations.

Even in the case where such methods are used, insufficient shifting to high threshold values is not improved sufficiently; and there is room for improvement.

BRIEF DESCRIPTION OF THE DRAWINGS

FIG. 2 to FIG. 4C are schematic views illustrating the configuration of the nonvolatile semiconductor memory device according to the first embodiment;

DETAILED DESCRIPTION

In general, according to one embodiment, a nonvolatile semiconductor memory device includes a memory cell array and a control unit. The memory cell array includes a plurality of memory cells. The control unit controls a signal applied to the plurality of memory cells. Each of the plurality of memory cells is settable to: a first state, a second state and a third state. The first state has a first threshold voltage distribution. The second state has a second threshold voltage distribution of a voltage higher than the first threshold voltage distribution. The third state has a third threshold voltage distribution of a voltage between the first threshold voltage distribution and the second threshold voltage distribution. In an operation of setting a second memory cell to the second state and setting a third memory cell to the third state, the second memory cell being one of the plurality of memory cells, the third memory cell being another one of the plurality of memory cells, the control unit performs a first operation, a second operation, a third operation and a fourth operation. The performing the first operation is to set the plurality of memory cells to the first state. The performing the second operation is to set the second memory cell to a state having a threshold voltage distribution between the second threshold voltage distribution and the third threshold voltage distribution after the first operation. The performing the third operation is to perform a weak writing to increase a threshold voltage distribution of the plurality of memory cells after the second operation. The performing the fourth operation is to set the third memory cell to the third state after the third operation.

Exemplary embodiments of the invention will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among the drawings, even for identical portions.

In the specification and the drawings of the application, components similar to those described in regard to a drawing thereinabove are marked with like reference numerals, and a detailed description is omitted as appropriate.

First Embodiment

A nonvolatile semiconductor memory device according to an embodiment of the invention is a multi-level storage memory device, and more specifically, a NAND cell flash memory.

Figure 1:
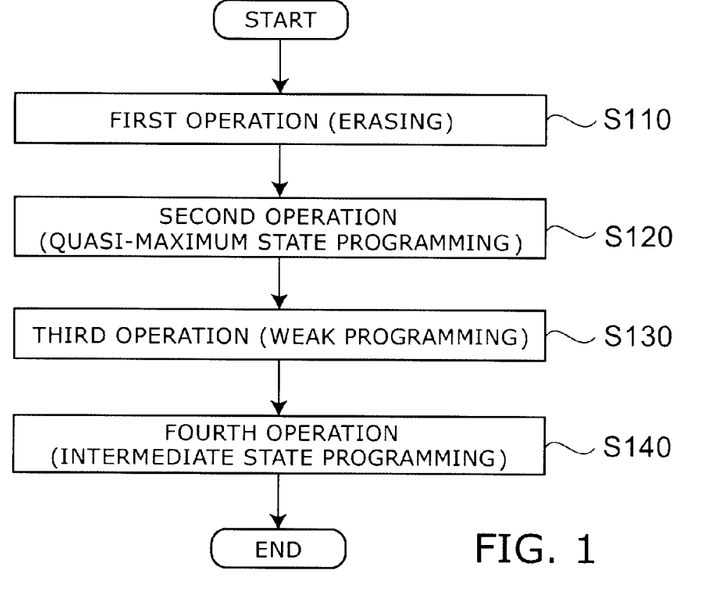
FIG. 1 is a flowchart illustrating operations of a nonvolatile semiconductor memory device according to a first embodiment.

FIG. 1 is a flowchart illustrating operations of the nonvolatile semiconductor memory device according to the first embodiment of the invention.

FIG. 2 to FIG. 4C are schematic views illustrating the configuration of the nonvolatile semiconductor memory device according to the first embodiment of the invention.

Figure 2:
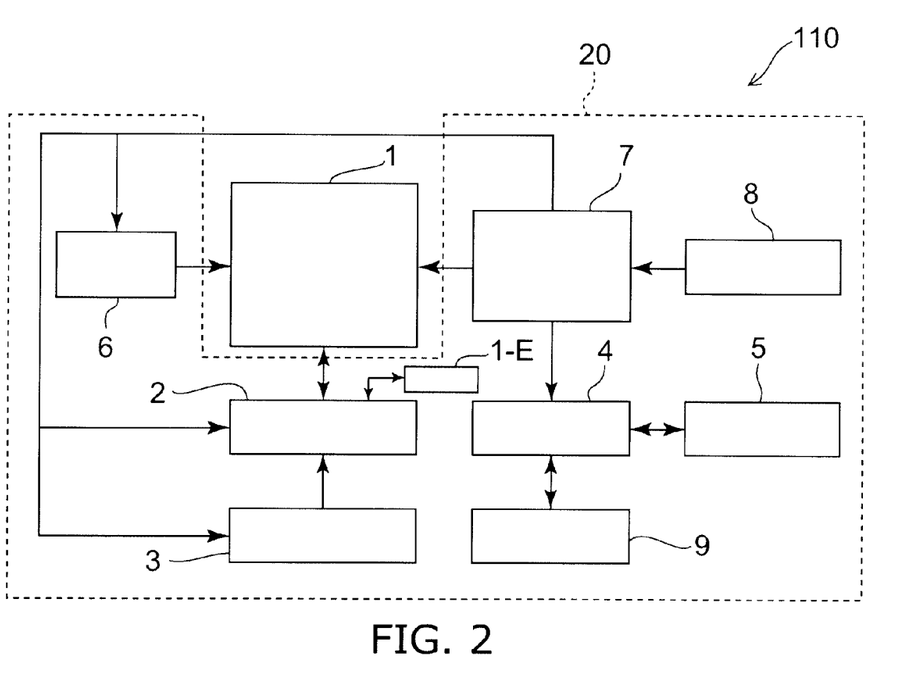
Figure 3:
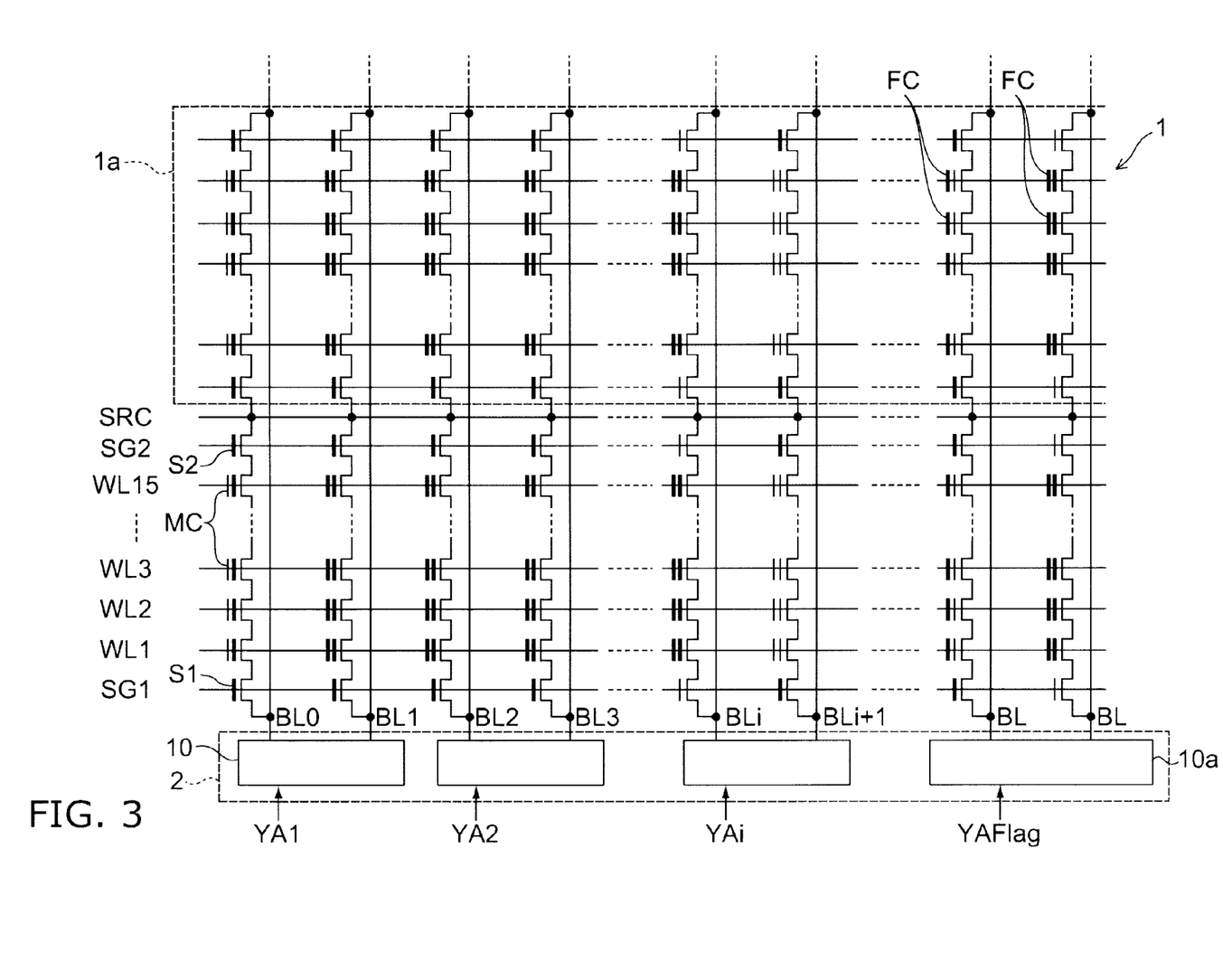
Figure 4A:
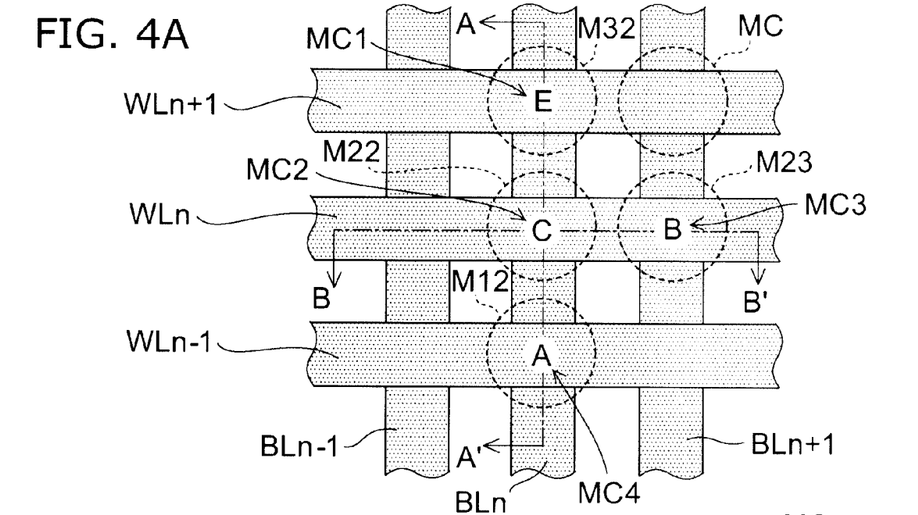
Figure 4B:
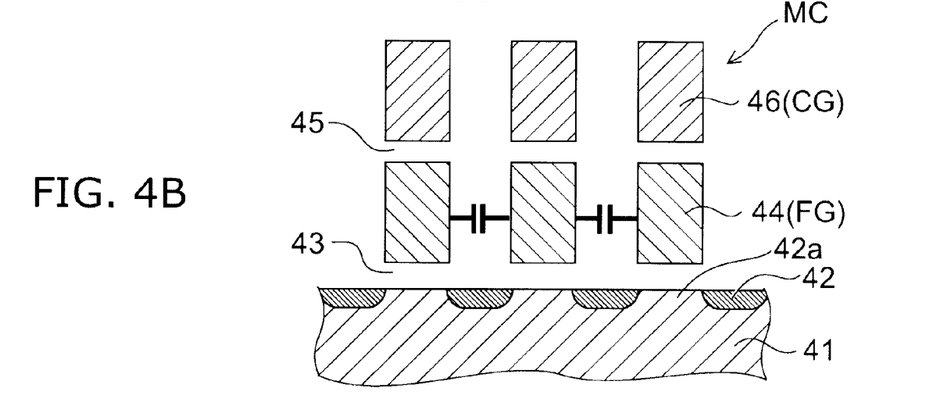
Figure 4C:
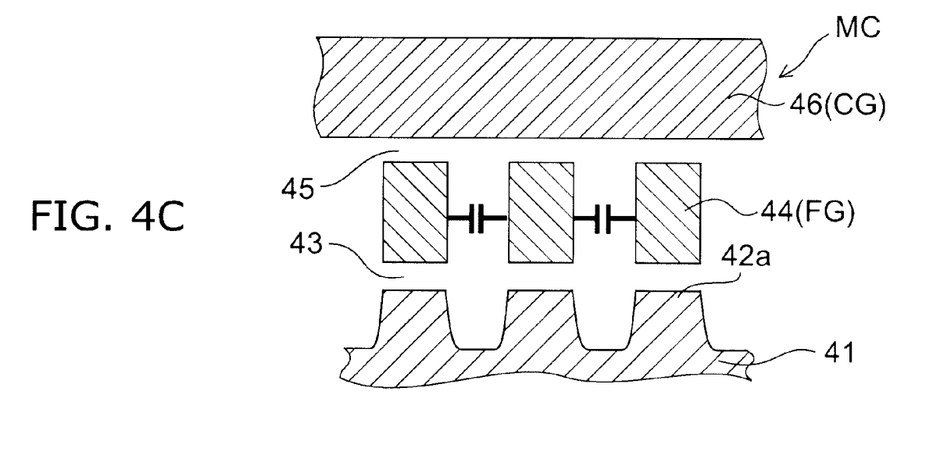

Namely, FIG. 2 is a block diagram of the nonvolatile semiconductor memory device. FIG. 3 is a partial schematic circuit diagram of the nonvolatile semiconductor memory device. FIG. 4A is a schematic plan view of memory cells of the nonvolatile semiconductor memory device. FIG. 4B is a cross-sectional view along line A-A' of FIG. 4A. FIG. 4C is a cross-sectional view along line B-B' of FIG. 4A. Insulating portions are omitted in FIGS. 4B and 4C.

Figure 5:
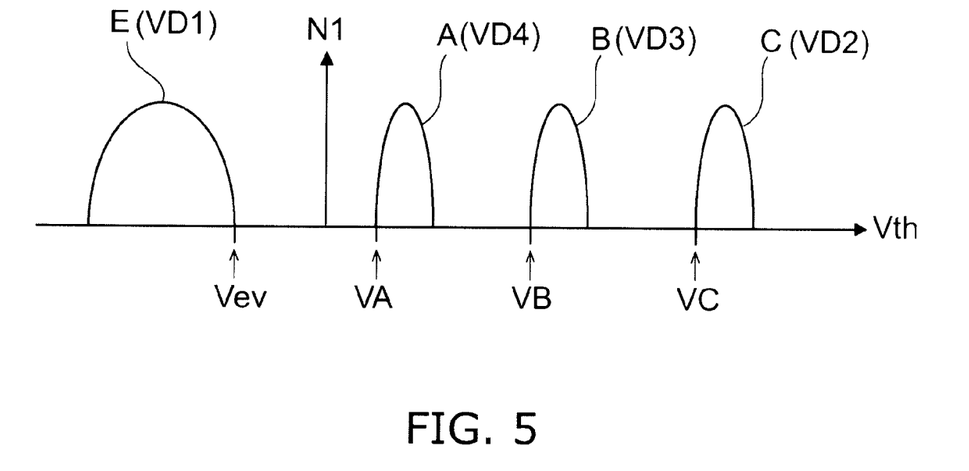
FIG. 5 is a schematic view illustrating characteristics of the nonvolatile semiconductor memory device according to the first embodiment.

FIG. 5 is a schematic view illustrating characteristics of the nonvolatile semiconductor memory device according to the first embodiment of the invention.

Namely, FIG. 5 illustrates characteristics of memory cells included in the nonvolatile semiconductor memory device. In FIG. 5, a threshold voltage Vth of the memory cells is plotted on the horizontal axis; and an occurrence frequency N1 is plotted on the vertical axis.

First, an example of the configuration of the nonvolatile semiconductor memory device according to this embodiment will be described using FIG. 2 to FIG. 5.

As illustrated in FIG. 2, a nonvolatile semiconductor memory device 110 according to this embodiment includes a memory cell array 1 and a control unit 20.

The control unit 20 controls a signal applied to the multiple memory cells as described below.

Namely, the memory cell array 1 includes multiple memory cells (not illustrated) disposed in a matrix configuration as described below. That is, the memory cell array 1 includes multiple bit lines, multiple word lines, and a common source line; and includes memory cells disposed in a matrix configuration at the intersections between the bit lines and the word lines. The memory cell has the function of storing data and is a storage element for which electrically overwriting data is possible.

In this specific example, the control unit 20 includes a bit line control circuit 2, a column decoder 3, a data input/output buffer 4, a data input/output terminal 5, a word line control circuit 6, a control circuit 7, a control signal input terminal 8, and a defective block determination circuit 9. However, any of these components may be provided separately from the control unit 20. Hereinbelow, the case is described where the control unit 20 includes these components.

The bit line control circuit 2 for controlling the bit lines and the word line control circuit 6 for controlling the word line voltages are connected to the memory cell array 1. The bit line control circuit 2 reads data of the memory cells in the memory cell array 1 via the bit lines, and further, applies a write control voltage to the memory cells in the memory cell array 1 via the bit lines to write to the memory cells.

The column decoder 3, the data input/output buffer 4, and the data input/output terminal 5 are connected to the bit line control circuit 2. The data of the memory cells read from the memory cell array 1 is output externally from the data input/output terminal 5 via the bit line control circuit 2 and the data input/output buffer 4. Write data that is externally input to the data input/output terminal 5 is input to the bit line control circuit 2 by the column decoder 3 via the data input/output buffer 4 and written to the designated memory cells.

The memory cell array 1, the bit line control circuit 2, the column decoder 3, the data input/output buffer 4, and the word line control circuit 6 are connected to the control circuit 7. The control circuit 7 generates a control signal and a control voltage for controlling the memory cell array 1, the bit line control circuit 2, the column decoder 3, the data input/output buffer 4, and the word line control circuit 6 according to a control signal input to the control signal input/output terminal 8.

The defective block determination circuit 9 is connected to the data input/output buffer 4 and determines whether or not the block to be read is a defective block according to the data that was read.

FIG. 3 illustrates the configuration of the memory cell array 1 and the bit line control circuit 2. The memory cell array 1 is a NAND cell memory array including multiple NAND cells. One NAND cell includes, for example, sixteen memory cells MC made of EEPROM connected in series and having a first selection gate S1 and a second selection gate S2 connected to either end.

The first selection gate S1 is connected to a bit line BL0. The second selection gate S2 is connected to a source line SRC. The control gates of the memory cells MC disposed in the same row are commonly connected to word lines WL0 to WL15. The first selection gates S1 are commonly connected to a first selection line SG1. The second selection gates S2 are commonly connected to a second selection line SG2.

In this specific example, the memory cell array 1 includes multiple memory cell blocks 1a. Each of the memory cell blocks 1a includes multiple NAND cells including multiple memory cells MC. In other words, the multiple memory cells MC included in the memory cell array 1 are subdivided into several groups; and the subdivided groups form the memory cell blocks 1a.

The bit line control circuit 2 includes multiple data storage circuits 10 and a flag data storage circuit 10a. A pair of bit lines (BL0, BL1), (BL2, BL3), ..., (BLi, BLi+1), (BL, BL) is connected to each of the data storage circuits 10 and the flag data storage circuit 10a. Here, the suffix i recited above is an integer of zero or more. Each of the data storage circuits 10 has a function of retaining the data read from the memory cells MC and a function of retaining the data written to the memory cells MC. Each of the data storage circuits 10 has a function of manipulating internal data when performing multi-level storage.

In this specific example, data is erased, for example, in units of memory cell blocks 1a. An erasing operation may be performed, for example, simultaneously for the two bit lines connected to the data storage circuits 10 and the flag data storage circuit 10a.

For example, multiple memory cells disposed on every other bit line and connected to one word line may form one sector. Data may be written and read for each sector.

Each of the word lines, for example, may be connected to a flag cell FC for storing flag data.

In a reading operation, a verifying operation, and a writing operation, one bit line from the two bit lines (BLi, BLi+1) connected to each of the data storage circuits 10 is selected according to an externally designated address signal (YA1, YA2, ..., YAi, YAFlag). Further, one word line is selected according to an external address to select one sector.

As illustrated in FIG. 4A, a memory cell MC is provided corresponding to each of the intersections of a word line WLn−1, a word line WLn, and a word line WLn+1 with a bit line BLn−1, a bit line BLn, and a bit line BLn+1. Here, the suffix n recited above is an integer of 1 or more.

As illustrated in FIGS. 4B and 4C, the memory cell MC includes a substrate 41 (a semiconductor substrate), multiple diffusion regions 42 provided on a major surface of the substrate 41, a channel region 42a provided between the multiple diffusion regions 42 of the substrate 41, a floating gate 44 (a floating gate FG) provided on the channel region 42a, a control gate 46 (a control gate CG) provided on the floating gate 44, a first insulating film 43 provided between the channel region 42a and the floating gate 44, and a second insulating film 45 provided between the floating gate 44 and the control gate 46.

In other words, the memory cell MC is a MOSFET having a floating gate. The diffusion regions 42 function as the source region and the drain region of the MOSFET and are, for example, n-type conductive layers.

However, the invention is not limited thereto. Rather than having a floating gate structure, the memory cell MC may have, for example, a MONOS (Metal Oxide Nitride Oxide Semiconductor) structure and the like.

In other words, the memory cell MC includes: a first and a second second-conductivity-type semiconductor regions (the diffusion regions 42) provided in a first-conductivity-type substrate (the substrate 41); a first-conductivity-type semiconductor region (the channel region 42a) between the first and second second-conductivity-type semiconductor regions; the control gate 46 to control a conduction/non-conduction between the first and second second-conductivity-type semiconductor regions; a storage layer (e.g., the floating gate 44, a charge storage layer, etc.) provided between the control gate 46 and the first-conductivity-type semiconductor region; and the first insulating film 43 provided between the channel region 42a and the storage layer.

The case will now be described where the storage layer recited above is the floating gate 44.

As illustrated in FIGS. 4B and 4C, adjacent memory cells MC may be capacitively coupled to each other. A design rule of, for example, 40 nm (nanometers) or less is applied to the memory cells MC of the nonvolatile semiconductor memory device 110; and the spacing between adjacent memory cells MC is narrow. Thereby, the potential of the floating gate FG of one memory cell MC, for example, may be changed by capacitive coupling due to an effect of the potential of the floating gate FG of one other memory cell MC adjacent to the one memory cell MC.

As illustrated in FIG. 5, each of the multiple memory cells MC has multi-level memory states.

In other words, the threshold value of each of the multiple memory cells MC is settable to a first state having a first threshold voltage distribution VD1, a second state having a second threshold voltage distribution VD2, and a third state having a third threshold voltage distribution VD3.

The voltage of the second threshold voltage distribution VD2 is higher than the first threshold voltage distribution. The voltage of the third threshold voltage distribution VD3 is between the first threshold voltage distribution VD1 and the second threshold voltage distribution VD2.

The first state corresponding to the first threshold voltage distribution VD1 corresponds to an E level and is an erase state. The first threshold voltage distribution VD1 may have, for example, a negative voltage.

On the other hand, the threshold voltage distributions other than the first threshold voltage distribution VD1 correspond to program states.

The second state corresponding to the second threshold voltage distribution VD2 corresponds to a C level having the highest threshold voltage. The third state corresponding to the third threshold voltage distribution VD3 corresponds to a B level having an intermediate threshold voltage.

This specific example is an example having a fourth memory state. The memory cell MC is further settable to a fourth state having a fourth threshold voltage distribution VD4.

The fourth state corresponding to the fourth threshold voltage distribution VD4 corresponds to an A level having a second intermediate threshold voltage.

Thus, although this specific example has four memory states (E<A<B<C), it is sufficient in this embodiment that multiple memory states exist. The number of memory states is arbitrary and may be more than four. The case of four memory states will now be described.

In each of the memory cells MC, the erasing operation is to set the memory cell MC to the first state; a C level programming is to set the memory cell MC to the second state; a B level programming is to set the memory cell MC to the third state; and an A level programming is to set the memory cell MC to the fourth state.

The erasing operation may be performed by, for example, applying an erasing voltage to the substrate 41, where the erasing voltage has a positive polarity with respect to the control gate 46. By applying the positive polarity voltage, the potential of the control gate 46 is a potential lower than the potential of the substrate 41.

The C level programming may be performed by, for example, applying the C level voltage to the control gate 46, where the C level voltage has a positive polarity with respect to the substrate 41. By applying the positive polarity voltage, the potential of the control gate 46 is a potential higher than the potential of the substrate 41. The B level programming may be performed by, for example, applying the B level voltage to the control gate 46, where the B level voltage has a positive polarity with respect to the substrate 41 and is lower than the C level voltage. The A level programming may be performed by, for example, applying the A level voltage to the control gate 46, where the A level voltage has a positive polarity with respect to the substrate 41 and is lower than the B level voltage.

Here, for example, a lower limit of the first threshold voltage distribution VD1 has a voltage less than an erase verification voltage Vev. A lower limit of the second threshold voltage distribution VD2 has a voltage not less than a C level verification voltage VC. A lower limit of the third threshold voltage distribution VD3 has a voltage not less than a B level verification voltage VB and less than the C level verification voltage VC. A lower limit of the fourth threshold voltage distribution VD4 has a voltage not less than an A level verification voltage VA and less than the B level verification voltage VB.

Hereinbelow, memory cells MC set to the first state to the fourth state are referred to as first to fourth memory cells MC1 to MC4, respectively.

As illustrated in FIG. 4A, the multiple memory cells MC provided in the matrix configuration can have different memory states in adjacent memory cells MC.

For example, of the multiple memory cells MC, one memory cell M22 is the second memory cell MC2 of the C level. Then, for example, an adjacent memory cell M23, which is adjacent to the one memory cell M22 in the word line direction is the third memory cell MC3 of the B level. An adjacent memory cell M12, for example, adjacent to the one memory cell M22 in one bit line direction is the fourth memory cell MC4 of the A level. An adjacent memory cell M32, for example, adjacent to the one memory cell M22 in the other bit line direction is the first memory cell MC1 of the E level. However, the configuration of the states of the memory cells MC illustrated in FIG. 4A is one example; and the configuration of the memory states of the invention is not limited thereto.

In other words, in the nonvolatile semiconductor memory device 110, at least one of the second memory cells MC2 and at least one of the third memory cells MC3 are adjacent to each other. At least one of the second memory cells MC2 and at least one of the fourth memory cells MC4 may be adjacent to each other.

Thus, in the nonvolatile semiconductor memory device 110, the states of the data of the memory cells are scrambled and disposed such that the memory cells MC of a designated state (for example the C level) are not concentrated. Methods for scrambling the data are described below.

In the nonvolatile semiconductor memory device 110 having such a configuration, in operations of setting the second memory cell MC2 to the second state (the C level programming) and setting the third memory cell MC3 to the third state (the B level programming), where the second memory cell MC2 is one of the multiple memory cells MC and the third memory cell MC3 is one other of the multiple memory cells MC, the control unit 20 implements the following operations.

Namely, as illustrated in FIG. 1, first, a first operation is implemented to set the multiple memory cells MC to the first state (step S110). In other words, an erasing operation is performed. The erasing operation can be performed for each of the memory cell blocks 1a.

In other words, the memory cell array 1 includes multiple memory cell blocks 1a. The first operation can be performed collectively to all of the multiple memory cells MC included in the memory cell block 1a. However, the invention is not limited thereto. It is sufficient that the erasing operation is performed at least on the second memory cell MC2 and the third memory cell MC3.

After the first operation, a second operation is implemented to set the second memory cell MC2 to a state in which a threshold voltage distribution of the second memory cell MC2 enters between the second threshold voltage distribution VD2 and the third threshold voltage distribution VD3 (step S120). In other words, the threshold voltage distribution is shifted to toward the highest threshold voltage distribution of the memory cell MC.

At this time, the second threshold voltage distribution VD2 of the highest voltage of the memory cell MC is not realized; and the threshold voltage of the second memory cell MC2 is a distribution near the second threshold voltage distribution VD2. It is "quasi-maximum state programming".

In other words, the threshold voltage of the second memory cell MC2 is set to a "quasi-second threshold voltage distribution" (a C1 level), which is near the second threshold voltage distribution VD2 but lower than the second threshold voltage distribution VD2. While the forming of the second threshold voltage distribution VD2 is referred to as the C level programming, the forming of the "quasi-second threshold voltage distribution" is referred to as a C1 level programming.

Then, after such a second operation, a third operation is implemented to perform a weak programming to increase the threshold voltage distribution of the multiple memory cells MC (step S130). That is, a soft programming is performed.

Such a soft programming is an operation of applying, to the memory cell MC, a voltage (a soft programming voltage) lower than the voltage (the A level programming voltage) applied to the memory cell MC to realize the second lowest threshold voltage distribution of the memory cell MC (in the characteristics illustrated in FIG. 5, the fourth threshold voltage distribution VD4, i.e., the A level). While the A level programming voltage having a positive polarity with respect to the substrate 41 is applied to the control gate 46 of the memory cell MC to realize the second lowest threshold voltage distribution, in the soft programming, the soft programming voltage having a positive polarity with respect to the substrate 41 and a value smaller than the A level programming voltage is applied to the control gate 46.

The soft programming is, for example, a fine adjustment programming to shift the threshold voltage distribution of the erased memory cells MC to the positive direction and make the threshold voltage distribution narrower. However, there is not only a case of making the threshold voltage distribution narrower but also a case of shifting the threshold voltage distribution parallel to the positive direction.

The third operation can be performed collectively to all of the multiple memory cells MC included in the memory cell block 1a. However, the invention is not limited thereto. The third operation may be performed on any memory cell MC included in the memory cell block 1a. In particular, the third operation may be implemented on at least one selected from the second memory cell MC2 and any cell (e.g., the first to fourth memory cells MC1 to MC4) adjacent to the second memory cell MC2.

After such a third operation, a fourth operation is implemented to set the third memory cell MC3 to the third state (step S140). That is, the B level programming, which is a programming of an intermediate state, is implemented.

Thereby, insufficient writing of the C level programming to a high threshold value (the second threshold voltage distribution VD2) can be improved. In other words, by actively utilizing the capacitive coupling effect between the memory cells MC to supplement the insufficient programming, the state of the highest threshold voltage distribution can be the desired state.

In other words, the threshold voltage distribution of the second memory cell MC2 is increased by at least one selected from the third operation (the soft programming) and the fourth operation (the B level writing) recited above; and the second memory cell MC2 reaches the second state (the C level). Restated, in the second operation, the threshold voltage distribution of the second memory cell MC2 is shifted to the C1 level which is a threshold voltage distribution lower than the C level. However, the threshold voltage distribution of the second memory cell MC2 is increased from the C1 level to the C level (the target second threshold voltage distribution VD1) by capacitive coupling between the second memory cell MC2 and a memory cell MC adjacent to the second memory cell MC2 due to at least one selected from the subsequent soft programming and the B level programming. As a result, the C level writing operation of the second memory cell MC2 is completed.

In other words, the increase of the threshold voltage distribution of the second memory cell MC2 of at least one selected from the third operation and the fourth operation may be based on a capacitive coupling effect between the second memory cell MC2 and a memory cell MC adjacent to the second memory cell MC2 of the multiple memory cells MC. The memory cell MC adjacent to the second memory cell MC2 is, for example, the third memory cell MC3.

Thus, in the nonvolatile semiconductor memory device 110, the control unit 20 performs operations in the order of the erasing operation, the C1 level programming (the quasi-maximum state programming), the soft programming, and the intermediate state programming. The intermediate state writing may be the programming of any intermediate state of the multi-level threshold voltage distributions.

In other words, in the nonvolatile semiconductor memory device 110, after the erasing operation, the second memory cell MC2 can be set to the state of the target C level by setting the second memory cell MC2 to a state of the highest possible threshold voltage (performing the quasi-maximum state programming, i.e., the C1 level programming) and subsequently using the capacitive coupling due to the soft programming and the programming of other levels to increase the threshold voltage distribution of the second memory cell MC2.

In a method of a comparative example discussed in JP-A 2001-126490 (Kokai), operations are performed in the sequence of an erasing operation, a programming to the highest threshold value (e.g., a C1 level programming), and a sequential programming from a low threshold value (e.g., an A level programming and then a B level programming); and a soft programming is not performed. Therefore, the threshold voltage distribution of the erase state is wide; and memory cells MC having extremely low threshold voltages exist. Therefore, for example, the fluctuation of the program states of the levels to the memory cells MC is large. In other words, even in the case where the programming to the other levels is performed after the C1 level programming is performed, the second memory cell MC2 is affected by the memory cells MC having extremely low threshold voltages; and it is difficult to set the second memory cell MC2 to the state of the target C level. Moreover, JP-A 2001-126490 (Kokai) does not discuss utilizing a capacitive coupling with adjacent memory cells to increase the threshold voltage after programming to the highest possible threshold voltage (the C1 level programming) to perform the programming to the highest threshold value (the C level) of the highest programming difficulty; and it is difficult to resolve insufficient programming with the technology discussed in JP-A 2001-126490 (Kokai).

In a method of a comparative example discussed in JP-A 2007-305204 (Kokai), firstly after the erasing operation, a soft programming is performed; and subsequently, the programming operations are performed. Therefore, the sequence is different from the sequence of this embodiment (the C1 level programming is directly after the erasing operation). In other words, in this comparative example, the high level programming is performed after the soft programming. Therefore, the threshold voltage of the memory cell MC (e.g., the second memory cell MC2) for which the high level programming is performed does not benefit from effects of the increase of the threshold voltage due to capacitive coupling of the soft programming. Therefore, it is difficult for the threshold voltage of the memory cells of the highest threshold voltage to sufficiently reach the target C level.

Conversely, in the nonvolatile semiconductor memory device 110 according to this embodiment, firstly after the erasing operation, the highest C1 level programming (the quasi-maximum state programming) is performed; and subsequently, the soft programming is implemented. Thereby, the lower limit of the threshold voltage distribution of the erase state can be increased; and the threshold voltage of the second memory cell MC2 for which the C1 level programming is performed can be increased by capacitive coupling. Subsequently, the intermediate state programming is performed. Thereby, the threshold voltage of the second memory cell MC2 can be further increased by the capacitive coupling effect; and the second memory cell MC2 can be set to the target C level.

FIRST EXAMPLE

As a specific example of this embodiment, an example of a case having four levels, that is, having the A level and the B level as intermediate states, will now be described as a first example. Here, multiple memory cells corresponding to the second memory cell MC2 illustrated in FIGS. 4A to 4C are taken to be a second memory cell group MC2' (not illustrated). Multiple memory cells corresponding to the third memory cell MC3 are taken to be a third memory cell group MC3' (not illustrated). Multiple memory cells corresponding to the fourth memory cell MC4 are taken to be a fourth memory cell group MC4' (not illustrated). Multiple memory cells corresponding to the first memory cell MC1 are taken to be a first memory cell group MC1' (not illustrated).

The first to fourth memory cell groups MC1' to MC4' refer to memory cells connected to the same word line WLn or either of the word line WLn-1 or the word line WLn+1 adjacent to the word line WLn.

Figure 6:
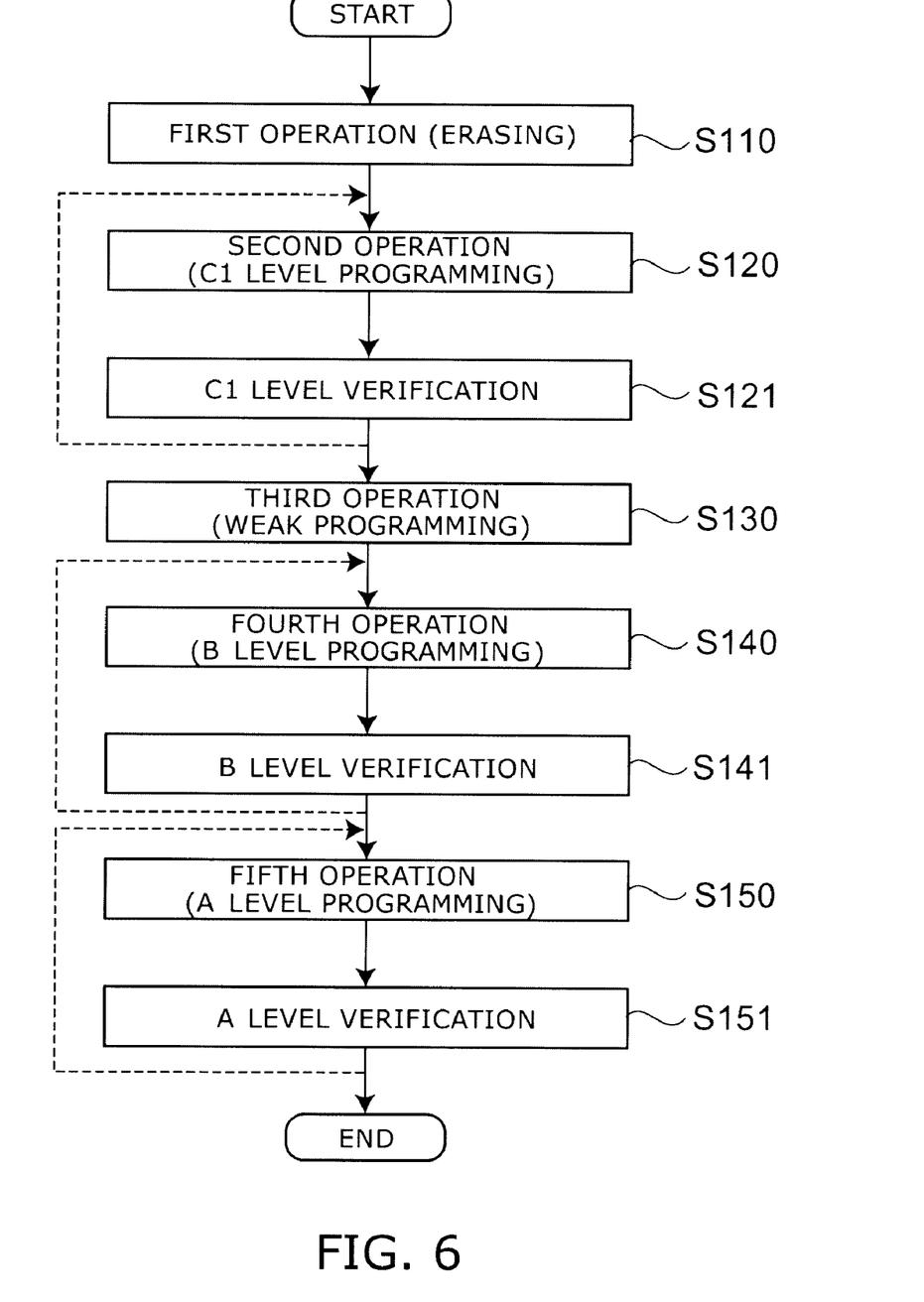
FIG. 6 is a flowchart illustrating operations of a nonvolatile semiconductor memory device according to a first example.

FIG. 6 is a flowchart illustrating operations of a nonvolatile semiconductor memory device according to the first example of the invention.

FIGS. 7A to 7E are schematic views illustrating operations of the nonvolatile semiconductor memory device according to the first example of the invention.

In the first example, first, the first operation (the erasing operation) is implemented to set the multiple memory cells MC to the first state as illustrated in FIG. 6 (step S110).

Figure 7A:
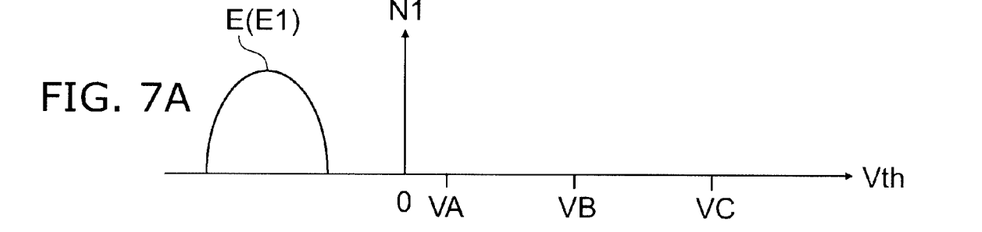
FIGS. 7A to 7E are schematic views illustrating operations of the nonvolatile semiconductor memory device according to the first example.

Thereby, as illustrated in FIG. 7A, the threshold value of the memory cells MC has a negative voltage and is at an E1 level (included in the E level) of the first threshold voltage distribution VD1. At this time, the threshold voltage distribution of the E1 level is relatively broad.

After the first operation, the second operation (the C1 level programming) is implemented to set the second memory cell group MC2' to a state having a threshold voltage distribution between the second threshold voltage distribution VD2 and the third threshold voltage distribution VD3 (step S120).

Subsequently, a C1 level verification is performed (step S121)

Figure 7B:
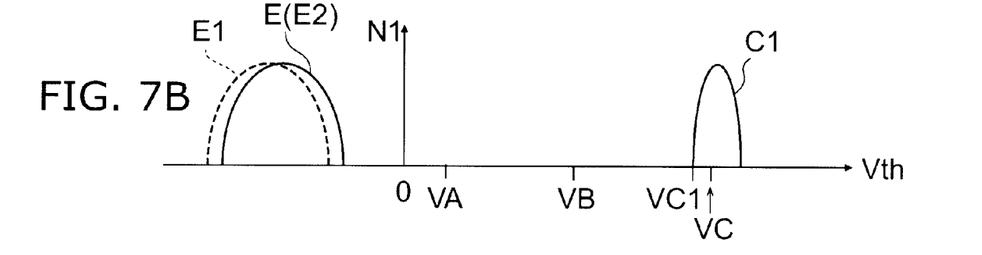

In other words, as illustrated in FIG. 7B, the lower limit of the threshold voltage distribution of the second memory cell group MC2' is not less than a C1 level verification voltage VC1. The C1 level verification voltage VC1 is a voltage lower than the C level verification voltage VC. In the case where, for example, the threshold voltage of the second memory cell MC2 in the second memory cell group MC2' is lower than the C1 level verification voltage VC1 in the C1 level verification (step S121), the C1 level programming (step S120) is performed again. In other words, step S120 and step S121 are repeated until the lower limit of the threshold voltage distribution of the second memory cell group MC2' is not less than the C1 level verification voltage VC1.

At this time, the threshold voltage distribution of the memory cells MC in the erase state are set to an E2 level (included in the E level) and is higher than the state (the E1 level) illustrated in FIG. 7A. The increase of the threshold voltage distribution of the memory cells MC of the erase state is based on, for example, capacitive coupling effects between the second memory cells MC2 and the memory cells MC of the erase state After the second operation, the third operation is implemented to perform a weak programming (a soft programming) to increase the threshold voltage distribution of the multiple memory cells MC (step S130). The third operation may be performed collectively, for example, on all of the multiple memory cells MC included in the memory cell block 1a.

Figure 7C:
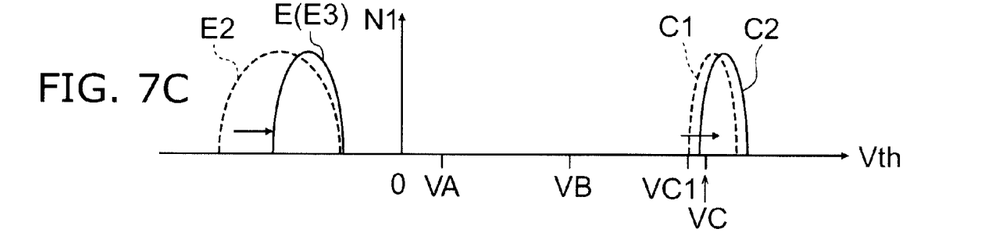

Thereby, as illustrated in FIG. 7C, the threshold voltage distribution of the memory cells MC in the erase state is set to an E3 level (included in the E level) and is narrower than the state (the E2 level) illustrated in FIG. 7B. In other words, the lower limit of the threshold voltage distribution of the E3 level increases, for example, about 1 to 2 V (volts) from the lower limit of the threshold voltage distribution of the E2 level.

Simultaneously thereto, the threshold voltage distribution of the second memory cell group MC2' is set to a C2 level, which is higher than the C1 level. In other words, the lower limit of the threshold voltage distribution of the C2 level increases, for example, about 0.2 V from the lower limit of the threshold voltage distribution of the C1 level. The increase of the threshold voltage distribution of the second memory cell group MC2' occurs due to capacitive coupling effects between the second memory cells MC2 and other memory cells MC adjacent to the second memory cells MC2.

After the third operation, the fourth operation (the B level writing) is implemented to set the third memory cell group MC3' to the third state (step S140).

Subsequently, the B level verification is performed (step S141).

Figure 7D:
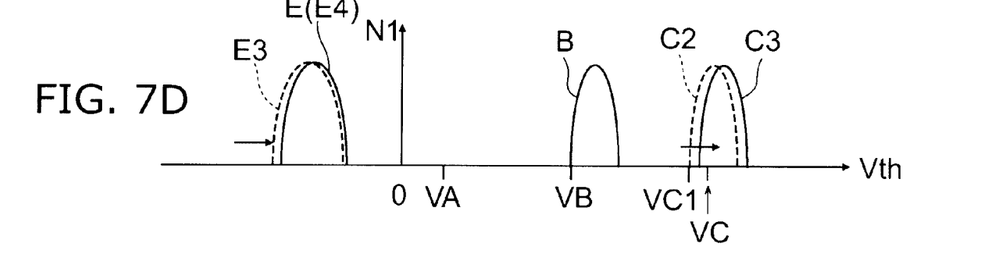

In other words, as illustrated in FIG. 7D, the threshold voltage distribution of the third memory cell group MC3' is set to, for example, substantially the target B level; and the lower limit thereof is not less than the B level verification voltage VB. In the case where, for example, the threshold voltage of the third memory cell MC3 in the third memory cell group MC3' is lower than the B level verification voltage VB in the B level verification (step S141), the B level programming (step S140) is performed again. In other words, step S140 and step S141 are repeated until the lower limit of the threshold voltage distribution of the third memory cell group MC3' is not less than the B level verification voltage VB.

At this time, the threshold voltage distribution of the second memory cell group MC2' is set to a C3 level, which is higher than the C2 level recited above. In other words, the lower limit of the threshold voltage distribution of the C3 level increases, for example, about 0.1 V from the lower limit of the threshold voltage distribution of the C2 level. The increase of the threshold voltage distribution occurs due to capacitive coupling effects between the second memory cells MC2 and other memory cells MC (e.g., the third memory cells MC3) adjacent thereto.

At this time, the threshold voltage distribution of the memory cells MC in the erase state is set to an E4 level (included in the E level) and is higher than the state (the E3 level) illustrated in FIG. 7C. The increase of the threshold voltage distributions of the memory cells MC in the erase state is based on, for example, capacitive coupling effects between the memory cells MC of the erase state and at least one selected from the second memory cells MC2 and the third memory cells MC3.

After the fourth operation, the fifth operation (the A level programming) is implemented to set the fourth memory cell group MC4' to the fourth state (step S150).

Subsequently, the A level verification is performed (step S151).

Thus, the control unit 20 performs at least one selected from further implementing, in the second operation, the second verifying operation of the second memory cells MC2 being in the state having the threshold voltage distribution between the second threshold voltage distribution VD2 and the third threshold voltage distribution VD3 and further implementing, in the fourth operation, the fourth verifying operation of the third memory cells MC3 being in the third state.

Also, the control unit 20 further implements, in the fifth operation, the fifth verifying operation of the fourth memory cells MC4 being in the fourth state.

Figure 7E:
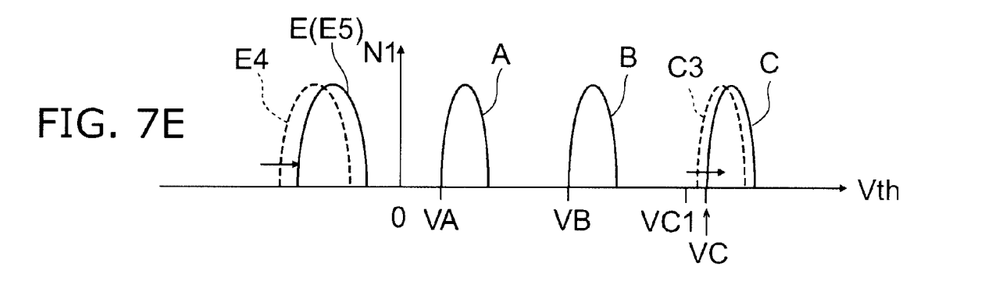

In other words, as illustrated in FIG. 7E, the threshold voltage distribution of the fourth memory cell group MC4' is set to substantially the target A level; and the lower limit thereof is not less than the A level verification voltage VA. In the case where, for example, the threshold voltage of the fourth memory cell MC4 in the fourth memory cell group MC4' is lower than the A level verification voltage VA in the A level verification (step S151), the A level writing (step S150) is performed again. In other words, step S150 and step S151 are repeated until the lower limit of the threshold voltage distribution of the fourth memory cell group MC4' is not less than the A level verification voltage VA.

At this time, the threshold voltage distribution of the second memory cell group MC2' increases from the C3 level recited above to the target C level. In other words, the lower limit of the threshold voltage distribution of the second memory cell group MC2' is not less than the C level verification voltage VC. The lower limit of the threshold voltage distribution of the C level increases, for example, about 0.1 V from the lower limit of the threshold voltage distribution of the C3 level. The increase of the threshold voltage distribution occurs due to capacitive coupling effects between the second memory cells MC2 and other memory cells MC (e.g., at least one selected from the third memory cells MC3 and the fourth memory cells MC4) adjacent thereto.

At this time, the threshold voltage distribution of the memory cells MC in the erase state are set to an E5 level (included in the E level) and is higher than the state (the E4 level) illustrated in FIG. 7D. The increase of the threshold voltage distribution of the memory cells MC of the erase state is based on, for example, capacitive coupling effects between the memory cells MC of the erase state and at least one selected from the second to fourth memory cells MC2 to MC4.

Thereby, insufficient writing of the C level programming to a high threshold value (the second threshold voltage distribution VD2) can be improved.

The values that the lower limits of the threshold voltage distributions increase in the operations recited above are examples; and the invention is not limited thereto. It is sufficient that the second memory cell MC2 increases from the C1 level of the second operation to substantially the target C level by implementing at least one selected from the third operation and the fourth operation.

By performing the B level programming prior to the A level programming, the distance between the threshold voltage distribution of the A level and the threshold voltage distribution of the B level can be wide. As a result, defects due to inter-cell interference in which the threshold value of the A level of the memory cell MC undesirably increases to the threshold voltage distribution of the B level can be reduced.

SECOND EXAMPLE

In a second example of another specific example according to this embodiment, the sequence of the B level writing and the A level writing of the first example is reversed.

Figure 8:
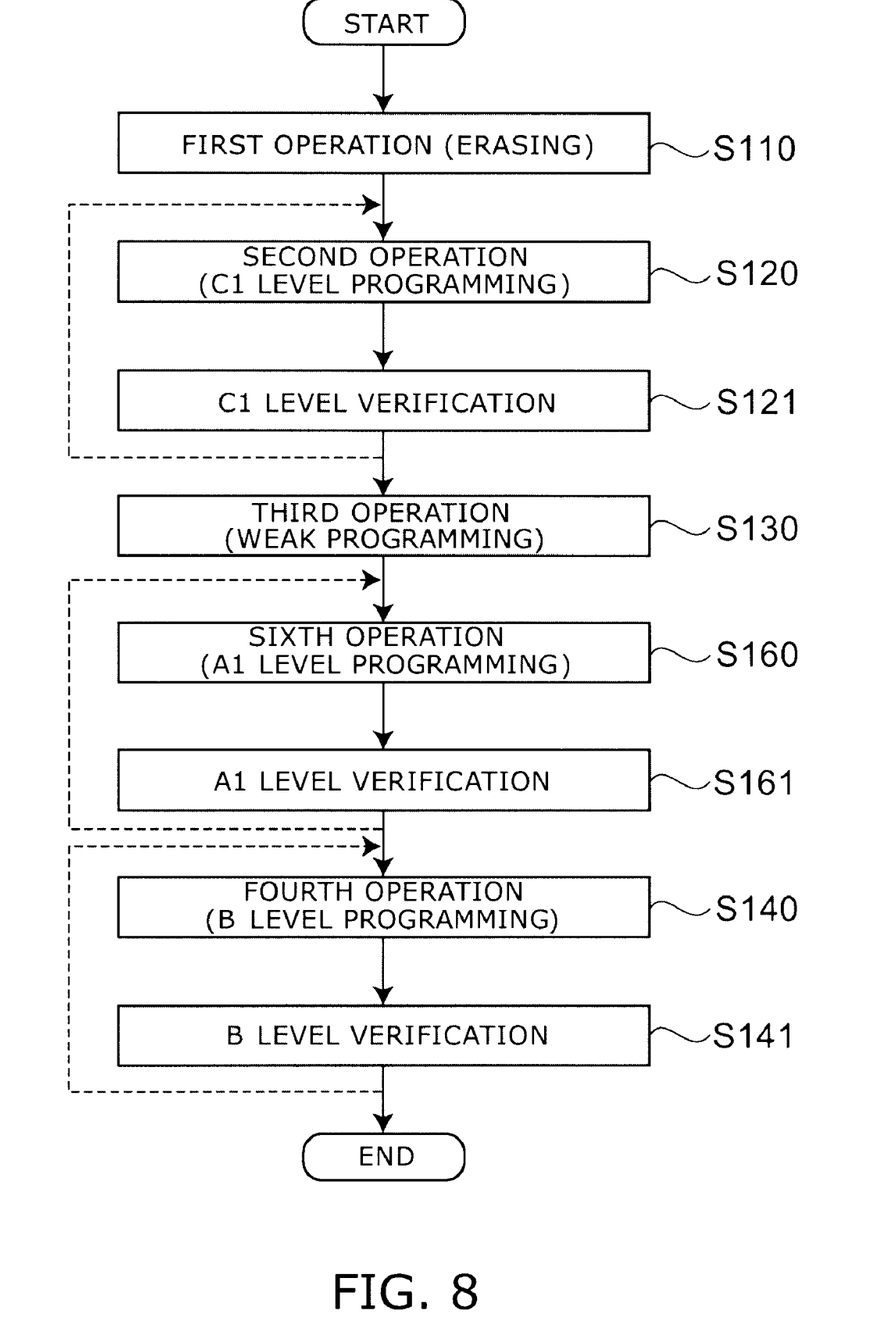
FIG. 8 is a flowchart illustrating operations of a nonvolatile semiconductor memory device according to a second example.

FIG. 8 is a flowchart illustrating operations of the nonvolatile semiconductor memory device according to the second example of the invention.

FIGS. 9A to 9E are schematic views illustrating operations of the nonvolatile semiconductor memory device according to the second example of the invention.

As illustrated in FIG. 8, in the second example, after implementing the erasing operation (step S110), the C1 level programming (step S120), the C1 level verification (step S121), and the weak programming (the soft programming) (step S130), a sixth operation is implemented to perform an A1 level programming to set the fourth memory cell MC4 to the A1 level, which is lower than the target A level (step S160). The A1 level is a level of a voltage lower than the A level, which is the target of the fourth memory cell MC4, and is a level between the fourth state (the A level) and the first state (the E level).

Then, an A1 level verification is performed (step S161).

Figure 9A:
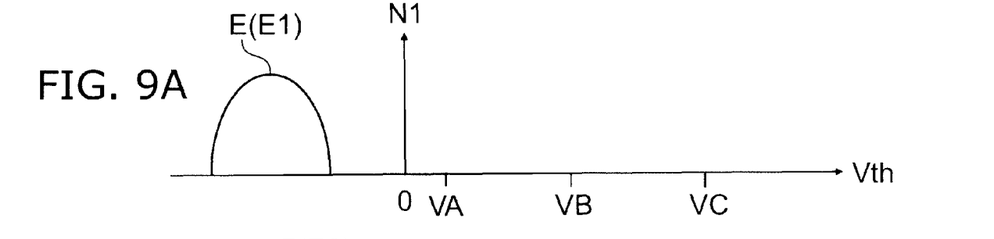
FIGS. 9A to 9E are schematic views illustrating operations of the nonvolatile semiconductor memory device according to the second example.
Figure 9B:
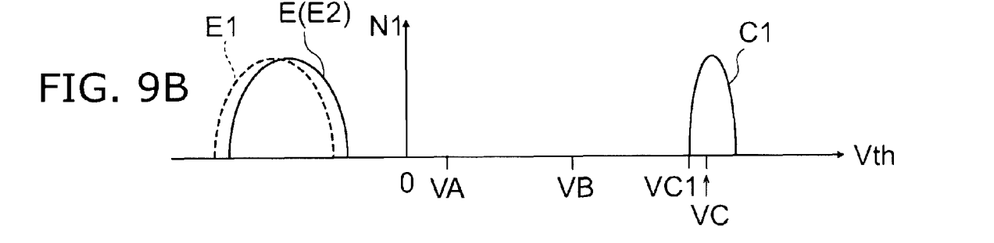
Figure 9C:
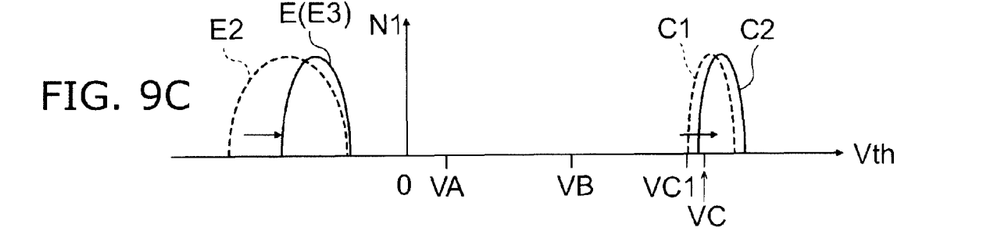
Figure 9D:
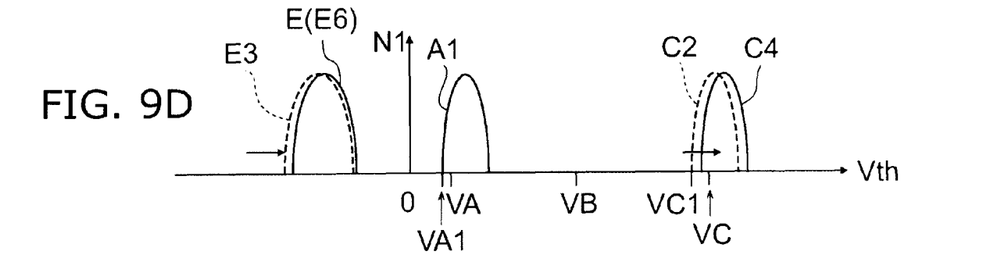

In other words, as illustrated in FIG. 9D, the threshold voltage distribution of the fourth memory cell group MC4' is set to the A1 level; and the lower limit thereof is not less than an A1 level verification voltage VA1. In the case where, for example, the threshold voltage of the fourth memory cell MC4 in the fourth memory cell group MC4' is lower than the A1 level verification voltage VA1 in the A1 level verification (step S161), the A1 level programming (step S160) is performed again. In other words, step S160 and step S161 are repeated until the lower limit of the threshold voltage distribution of the fourth memory cell group MC4' is not less than the A1 level verification voltage VA1.

At this time, the threshold voltage distribution of the second memory cell group MC2' is set to a C4 level, which is higher than the C2 level generated by the third operation. The increase of the threshold voltage distribution occurs due to capacitive coupling effects between the second memory cells MC2 and other memory cells MC (e.g., the fourth memory cells MC4) adjacent thereto.

The threshold voltage distribution of the memory cells MC in the erase state is set to an E6 level (included in the E level) and is higher than the state (the E3 level) illustrated in FIG. 9C. The increase of the threshold voltage distribution of the memory cells MC of the erase state is based on, for example, capacitive coupling effects between the memory cells MC of the erase state and at least one selected from the second memory cells MC2 and the fourth memory cells MC4.

After the sixth operation, the fourth operation (the B level programming) is implemented to set the third memory cell group MC3' to the third state (step S140); and the B level verification is performed (step S141).

Thus, the control unit 20 performs at least one selected from further implementing, in the second operation, the second verifying operation of the second memory cell MC2 being in a state having a threshold voltage distribution between the second threshold voltage distribution VD2 and the third threshold voltage distribution VD3 and further implementing, in the fourth operation, the fourth verifying operation of the third memory cell MC3 being in the third state.

The control unit 20 further implements, in the sixth operation, the fifth verifying operation of the fourth memory cell MC4 being in the fourth state.

Figure 9E:
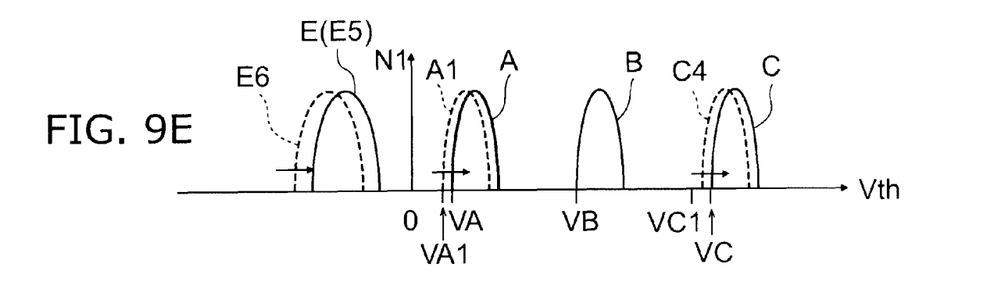

Thereby, as illustrated in FIG. 9E, the third memory cell group MC3' is shifted to the B level.

At this time, the threshold voltage distribution of the second memory cell group MC2' increases from the C4 level recited above and is set to the target C level. The increase of the threshold voltage distribution occurs due to capacitive coupling effects between the second memory cells MC2 and other memory cells MC (e.g., at least one selected from the third memory cells MC3 and the fourth memory cells MC4) adjacent thereto.

The threshold voltage distribution of the fourth memory cell group MC4' increases from the A1 level recited above and is set to the target A level. The increase of the threshold voltage distribution occurs due to capacitive coupling effects between the fourth memory cells MC4 and other memory cells MC (e.g., at least one selected from the second memory cells MC2 and the third memory cells MC3) adjacent thereto.

Further, the threshold voltage distribution of the memory cells MC in the erase state is set by capacitive coupling to an E7 level (included in the E level), which is higher than the E6 level. The increase of the threshold voltage distribution of the memory cells MC in the erase state is based on, for example, capacitive coupling effects between the memory cells MC of the erase state and at least one selected from the second to fourth memory cells MC2 to MC4.

Thus, in the second example, the sixth operation is implemented between the third operation (step S130) and the fourth operation (step S140) to set the fourth memory cell MC4 to a state between the fourth state and the first state.

Thus, in the second example as well, the control unit 20 performs operation in the order of the erasing operation, the C1 level programming (the quasi-maximum state programming), the soft programming, and the intermediate state programming (the A1 level programming and then the B level programming). As a result, the insufficient programming can be improved by firstly setting the second memory cell MC2 to a state having as high a threshold voltage as possible (the quasi-maximum state programming) and subsequently using capacitive coupling effects due to the soft programming and the programming of other levels to increase the threshold voltage distribution of the second memory cell MC2 to the state of the target C level by performing the operations Further, by performing the A level programming prior to the B level programming, the distance between the B level threshold voltage distribution and the C level threshold voltage distribution can be wide. As a result, defects due to inter-cell interference in which the threshold value of the B level of the memory cell MC undesirably increases to the threshold voltage distribution of the C level can be reduced.

In this embodiment, a capacitive coupling effect is provided by disposing memory cells MC of other levels adjacent to the second memory cell MC2. Thereby, the threshold voltage state of the second memory cell MC2 is increased; and the target C level programming is realized. To this end, in this embodiment, the memory cells MC having different levels, for example, are disposed adjacent to each other as much as possible to avoid the memory cells of a designated level from being disposed together.

Methods for scrambling the data will now be described.

In a nonvolatile semiconductor memory device 110 according to this embodiment, a non-inversion and an inversion of the data are mixed (scrambled) such that the same data does not continue in the column direction; and the resulting data is programmed to the memory cells MC. In such a case, scrambling refers to changing one page of externally-input data (programming data) according to constant rules. A scramble table retains the constant rules, i.e., the scrambling formulas. The scramble table is stored in memory provided internally or externally to the nonvolatile semiconductor memory device 110. For example, the scramble table is stored in an extra region 1-E shown in FIG. 2.

Figure 10:
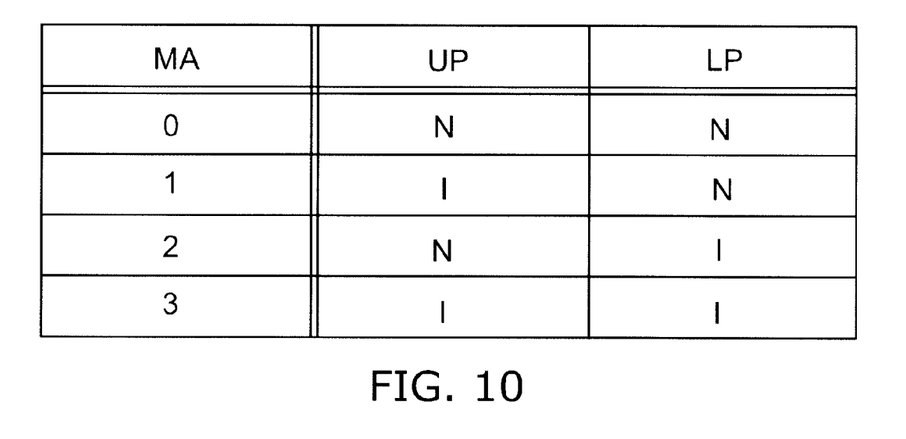
FIG. 10 is a schematic view illustrating scrambling formulas of the data of the nonvolatile semiconductor memory device according to the first embodiment.

FIG. 10 is a schematic view illustrating scrambling formulas of the data of the nonvolatile semiconductor memory device according to the first embodiment of the invention.

Namely, FIG. 10 illustrates the concept of the scramble table applied to the nonvolatile semiconductor memory device 110.

As illustrated in FIG. 10, the scramble table includes, for example, data of how to change data of an upper page UP and a lower page LP corresponding to addresses of word lines WL (hereinbelow referred to as "word line addresses") for each remainder MA when dividing by 4.

For example, in the case where the remainder MA is 0 when dividing the word line addresses by 4, the data to be written to the upper page UP and the lower page LP is written non-inverted (N). That is, the input data is programmed to the memory cells MC without being changed.

In the case where the remainder MA is 1, the data to be written to the upper page UP and the lower page LP is programmed inverted (I) and non-inverted (N), respectively.

In the case where the remainder MA is 2, the data to be written to the upper page UP and the lower page LP is programmed non-inverted (N) and inverted (I), respectively.

In the case where the remainder MA is 3, the data to be written to the upper page UP and the lower page LP is programmed inverted (I) for both.

As recited above, by using a scrambling formula to transform data for each of the remainders MA in case of dividing the word line addresses by 4, the word lines are classified into four groups; and the scrambling formula is changed for each group.

For example, the word lines WL0, WL4, WL8, and WL12 of the word line addresses of the word lines WL0 to WL15 may be classified into a first group. The word lines WL1, WL5, WL9, and WL13 may be classified into a second group. The word lines WL2, WL6, WL10, and WL14 may be classified into a third group. The word lines WL3, WL7, WL11, and WL15 may be classified into a fourth group. The word lines of each of the first to fourth groups may use mutually different scrambling formulas.

A scramble circuit for performing the processing recited above may be provided internally or externally to the nonvolatile semiconductor memory device 110.

One example of a data programming method of the nonvolatile semiconductor memory device 110 having the configuration recited above will now be described.

A case will now be described as one example in which a memory controller is provided in the nonvolatile semiconductor memory device 110. The memory controller includes memory that stores the scramble table, a scramble circuit, an MPU, and a flash controller. The memory controller may be provided separately from the nonvolatile semiconductor memory device 110.

Figure 11:
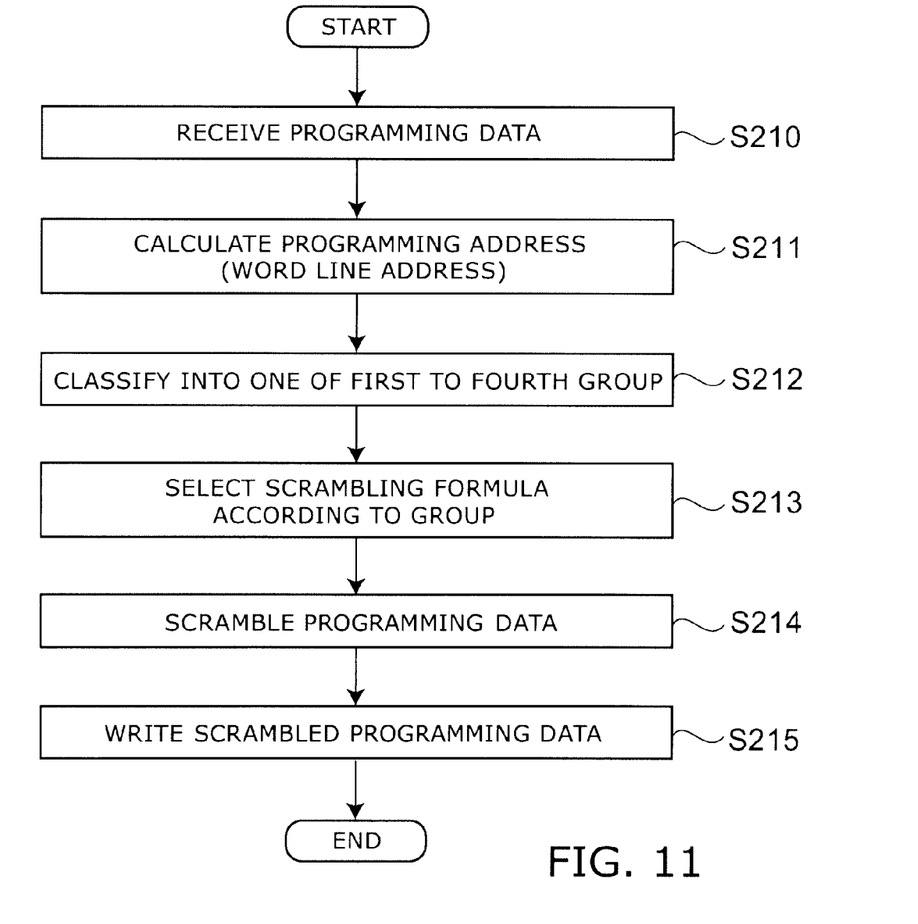
FIG. 11 is a flowchart illustrating operations of the nonvolatile semiconductor memory device according to the first embodiment.

FIG. 11 is a flowchart illustrating operations of the nonvolatile semiconductor memory device according to the first embodiment of the invention.

Namely, FIG. 11 illustrates the data scrambling method and the data writing operation applied to the nonvolatile semiconductor memory device 110.

As illustrated in FIG. 11, first, a host device provides a data programming command and programming data to the nonvolatile semiconductor memory device 110; and a host interface module of the memory controller receives the write command and the programming data (step S210).

The MPU calculates the addresses (hereinbelow, only the word line addresses are described) of the memory cells MC into which the received programming data is to be programmed (step S211).

The MPU determines, from the calculated word line addresses, which of the first to fourth groups corresponds to the word line WL corresponding to the word line address (step S212).

In other words, the remainder MA when M is divided by N is calculated, where "M" is the word line address and "N" (in this embodiment, N="4") is the number of groups. The word lines corresponding to each of the word line addresses corresponding to the remainders MA of "0" to "3" belong to the first to fourth groups, respectively.

The MPU refers to the scramble table stored in the memory. Then, the scrambling formulas are selected according to the group determined in step S212 (step S213).

For example, in the case where it is determined in step S212 that MA is "3" and the word line corresponding to the word line address belongs to the fourth group, the MPU selects the scrambling formula that inverts the write data for both the upper page UP and the lower page LP; and the selection result is provided to the scramble circuit.

The scramble circuit scrambles the programming data (step S214) according to the scrambling formula selected by the MPU in step S213.

For example, in the case of programming to upper page data of the word line WL belonging to the fourth group, all of the page data is inverted.

The programming data scrambled by the scramble circuit is provided to the memory cell array 1 via the flash controller and written to the memory cells MC (step S215).

When reading the data, the data is read from the memory cells MC according to the addresses externally provided; and the MPU reads the scrambling formulas corresponding to the addresses from the scramble table. Then, the read data is deciphered according to the scrambling formulas that were read.

In the case of, for example, reading data of the lower page LP of the word lines belonging to the third group (the remainder MA of 3), the scrambling formula is an inversion (I) as illustrated in FIG. 10. Therefore, the MPU inverts the read data and outputs the result externally. Because such a reading method is performed, each page of data may be copied among word lines belonging to the same group.

The processing of the data using a scrambling formula such as that recited above may be implemented by the control unit 20.

In other words, the control unit 20 selects the scrambling formula of the data according to the word line address of the memory cells MC to which the data is to be written (step S213).

Then, the control unit 20 scrambles the data according to the selected scrambling formula (step S214).

The control unit 20 programs the scrambled data to the memory cells MC according to the word line addresses (step S215). Steps S110, S120, S130, and S140 described above may be implemented in the step S215.

In such a case, the multiple word lines having at least one word line interposed therebetween form a group; and the group is classified by the remainder when the word line address M (M being a natural number of 2 or more) is divided by N (N being a natural number of 2 or more). The same scrambling formula may be selected for the same group; and different scrambling formulas may be selected for different groups.

Such a data scrambling method is applicable to the operations of the nonvolatile semiconductor memory device according to the embodiments of the invention including the first and second examples. By applying this scrambling method, the possibility of all of the memory cells MC adjacent to the second memory cells MC2 having memory states similar to the second memory cells MC2 is low. In other words, one of the first to third memory cells MC1 to MC3 is adjacent to the second memory cell MC2. As a result, it is possible to actively utilize the capacitive coupling effects between the memory cells MC; and the insufficient writing of the second memory cell MC2 can be effectively resolved.

Second Embodiment

A second embodiment of the invention is a driving method of the nonvolatile semiconductor memory device in which the method illustrated in FIG. 1 may be implemented.

Namely, the driving method is a driving method of the nonvolatile semiconductor memory device 110 including the memory cell array 1 including the multiple memory cells MC, where each of the multiple memory cells MC is settable to the first state having the first threshold voltage distribution VD1, the second state having the second threshold voltage distribution VD2 of a voltage higher than the first threshold voltage distribution VD1, and the third state having the third threshold voltage distribution VD3 of a voltage between the first threshold voltage distribution VD1 and the second threshold voltage distribution VD2.

In an operation to set the second memory cell MC2 to the second state and set the third memory cell MC3 to the third state, where the second memory cell MC2 is one of the multiple memory cells MC and the third memory cell MC3 is one other of the multiple memory cells MC, the driving method implements as follows.

Namely, first, the first operation is implemented to set the multiple memory cells MC to the first state (step S110). Then, after the first operation, the second operation is implemented to set the second memory cell MC2 to a state having a threshold voltage distribution between the second threshold voltage distribution VD2 and the third threshold voltage distribution VD3 (step S120). After the second operation, the third operation is implemented to perform a weak writing to increase the threshold voltage distribution of the multiple memory cells MC (step S130). After the third operation, the fourth operation is implemented to set the third memory cell MC3 to the third state (step S140).

Thereby, the threshold voltage distribution of the second memory cell MC2 can be increased by capacitive coupling; and insufficient writing of a multi-bit nonvolatile semiconductor memory device can be improved.

Hereinabove, exemplary embodiments of the invention are described with reference to specific examples. However, the invention is not limited to these specific examples. For example, one skilled in the art may appropriately select specific configurations of components of nonvolatile semiconductor memory devices such as memory cell arrays, control units, memory cells, and the like from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all nonvolatile semiconductor memory devices practicable by an appropriate design modification by one skilled in the art based on the nonvolatile semiconductor memory devices described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention. For example, additions, deletions, or design modifications of components or additions, omissions, or condition modifications of processes appropriately made by one skilled in the art in regard to the embodiments described above are within the scope of the invention to the extent that the purport of the invention is included.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the invention.

The invention claimed is:

1. A nonvolatile semiconductor memory device, comprising:
a memory cell array including a plurality of memory cells; and
a control unit to control a signal applied to the plurality of memory cells, each of the plurality of memory cells being settable to:
a first state having a first threshold voltage distribution:
a second state having a second threshold voltage distribution of a voltage higher than the first threshold voltage distribution; and
a third state having a third threshold voltage distribution of a voltage between the first threshold voltage distribution and the second threshold voltage distribution,
the control unit, in an operation of setting a second memory cell to the second state and setting a third memory cell to the third state, the second memory cell being one of the plurality of memory cells, the third memory cell being another one of the plurality of memory cells, configured to perform:
a first operation of setting the plurality of memory cells to the first state;
a second operation of setting the second memory cell to a state having a threshold voltage distribution between the second threshold voltage distribution and the third threshold voltage distribution after the first operation;
a third operation of performing a weak programming to increase a threshold voltage distribution of the plurality of memory cells after the second operation; and
a fourth operation of setting the third memory cell to the third state after the third operation.

2. The device according to claim 1, wherein at least one selected from the third operation and the fourth operation increases a threshold voltage distribution of the second memory cell to set the second memory cell to the second state.

3. The device according to claim 1, wherein the third operation shifts a threshold voltage distribution of the plurality of memory cells including the second memory cell in a state having the threshold voltage distribution between the second threshold voltage distribution and the third threshold voltage distribution to a positive direction.

4. The device according to claim 1, wherein the second memory cell and the third memory cell are adjacent to each other.

5. The device according to claim 1, wherein at least one selected from the third operation and the fourth operation shifts a lower limit of a threshold voltage distribution of the second memory cell to a positive direction based on a capacitive coupling effect between the second memory cell and the third memory cell.

6. The device according to claim 1, wherein
the memory cell array includes a plurality of memory cell blocks including the plurality of memory cells, and
the first operation is collectively performed on a plurality of memory cells included in the memory cell blocks.

7. The device according to claim 1, wherein each of the plurality of memory cells includes: first and second second-conductivity-type semiconductor regions provided in a first-conductivity-type substrate; a first-conductivity-type semiconductor region between the first and second second-conductivity-type semiconductor regions; a control gate to control a conduction and a non-conduction between the first and second second-conductivity-type semiconductor regions; a storage layer provided between the control gate and the first-conductivity-type semiconductor region; and a first insulating film provided between the first-conductivity-type semiconductor region and the storage layer.

8. The device according to claim 1, wherein the control unit performs at least one selected from further performing a second verifying operation of setting a lower limit of a threshold of the second memory cell between the second threshold voltage distribution and the third threshold voltage distribution in the second operation, and further performing a fourth verifying operation of setting lower limit of a threshold of the third memory cell to the third state in the fourth operation.

9. The device according to claim 1, wherein the control unit:

scrambles the data; and performs the second operation and the fourth operation by programming the scrambled data to the plurality of memory cells.

10. The device according to claim 1, wherein:

each of the plurality of memory cells is further settable to a fourth state having a fourth threshold voltage distribution of a voltage between the first threshold voltage distribution and the third threshold voltage distribution; and in an operation of setting a fourth memory cell to the fourth state, the fourth memory cell being yet another one of the plurality of memory cells, the control unit:

performs a fifth operation of setting the fourth memory cell to the fourth state after the fourth operation.

11. The device according to claim 10, wherein the second memory cell and the fourth memory cell are adjacent to each other.

12. The device according to claim 10, wherein a lower limit of a threshold voltage distribution of the second memory cell is shifted to a positive direction based on a capacitive coupling effect between the second memory cell and at least one selected from the third memory cell and the fourth memory cell in at least one selected from the third operation and an operation setting the fourth memory cell to the fourth state.

13. The device according to claim 10, wherein the control unit further performs a fifth verifying operation of setting lower limit of the fourth memory cell to the fourth state in the fifth operation.

14. The device according to claim 1, wherein each of the plurality of memory cells is further settable to a fourth state having a fourth threshold voltage distribution of a voltage between the first threshold voltage distribution and the third threshold voltage distribution; and in an operation of setting a fourth memory cell to the fourth state, the fourth memory cell being yet another one of the plurality of memory cells, the control unit:

performs a sixth operation to set the fourth memory cell to a state between the fourth state and the first state between the third operation and the fourth operation.

15. The device according to claim 14, wherein the second memory cell and the fourth memory cell are adjacent to each other.

16. The device according to claim 14, wherein a lower limit of a threshold voltage distribution of the second memory cell is shifted to a positive direction based on a capacitive coupling effect between the second memory cell and at least one selected from the third memory cell and the fourth memory cell in at least one selected from the third operation and an operation setting the fourth memory cell to the fourth state.

17. The device according to claim 14, wherein the control unit further performs a sixth verifying operation of setting the fourth memory cell to the fourth state in the sixth operation.

18. The device according to claim 13, wherein a lower limit of a threshold voltage distribution of the second memory cell is not less than a lower limit of the second threshold voltage distribution.

19. The device according to claim 17, wherein a lower limit of a threshold voltage distribution of the second memory cell is not less than a lower limit of the second threshold voltage distribution.

* * * * *